US008384116B2

(12) United States Patent
Ohtorii et al.

(10) Patent No.: US 8,384,116 B2
(45) Date of Patent: Feb. 26, 2013

(54) SUBSTRATE WITH CHIPS MOUNTED THEREON, METHOD OF MANUFACTURING SUBSTRATE WITH CHIPS MOUNTED THEREON, DISPLAY, AND METHOD OF MANUFACTURING DISPLAY

(75) Inventors: Hiizu Ohtorii, Kanagawa (JP); Akiyoshi Aoyagi, Kanagawa (JP); Katsuhiro Tomoda, Kanagawa (JP)

(73) Assignee: Sony Corporation, Tokyo (JP)

( * ) Notice: Subject to any disclaimer, the term of this patent is extended or adjusted under 35 U.S.C. 154(b) by 324 days.

(21) Appl. No.: 12/622,639

(22) Filed: Nov. 20, 2009

(65) Prior Publication Data
US 2010/0123163 A1 May 20, 2010

(30) Foreign Application Priority Data
Nov. 20, 2008 (JP) ................. 2008-296512

(51) Int. Cl.
*H01L 33/00* (2010.01)
*H01L 23/48* (2006.01)
*H01L 23/52* (2006.01)
*H01L 23/40* (2006.01)

(52) U.S. Cl. .......... 257/99; 257/737; 257/779; 257/772; 257/780

(58) Field of Classification Search ............ 257/99, 257/625, 676, 779, 780–785, 737, 738, 750, 257/751, 753, 762, 763, 764, 766–772, 774
See application file for complete search history.

(56) References Cited

U.S. PATENT DOCUMENTS

| | | | | |
|---|---|---|---|---|
| 6,140,707 A | * | 10/2000 | Plepys et al. | 257/778 |
| 6,232,660 B1 | * | 5/2001 | Kakimoto et al. | 257/728 |
| 7,012,018 B2 | * | 3/2006 | Tellkamp | 438/614 |
| 2008/0026498 A1 | * | 1/2008 | Tarsa et al. | 438/26 |

FOREIGN PATENT DOCUMENTS

| | | |
|---|---|---|
| JP | 07-015046 | 1/1995 |
| JP | 07-263468 | 10/1995 |
| JP | 11-177148 | 7/1999 |
| JP | 2001-257218 | 9/2001 |
| JP | 2004-119944 | 4/2004 |
| JP | 2005-174979 | 6/2005 |
| JP | 2006-049777 | 2/2006 |
| JP | 2008-118071 | 5/2008 |
| JP | 2008-130861 | 6/2008 |
| WO | 2006/132139 | 2/2006 |

OTHER PUBLICATIONS

Japanese Office Action issued on Sep. 6, 2011 in connection with counterpart JP Appl. No. 2008-296512.
Japanese Patent Office Action corresponding to Japanese Serial No. 2008-296512 dated Sep. 16, 2010.

* cited by examiner

*Primary Examiner* — Chuong A. Luu
(74) *Attorney, Agent, or Firm* — SNR Denton US LLP

(57) ABSTRACT

Disclosed herein is a substrate with chip mounted thereon, including: a solder pattern having a plan-view shape in which projected parts are projected radially from a central part; and a chip fixed in the state of being aligned to the central part of the solder pattern.

12 Claims, 10 Drawing Sheets

FIG.2A   FIG.2B   FIG.2C
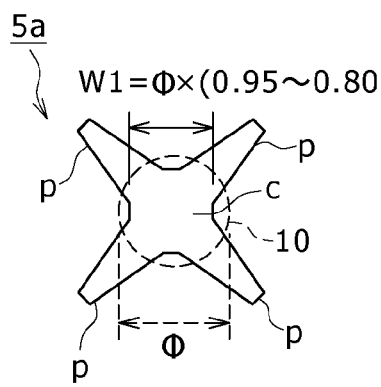
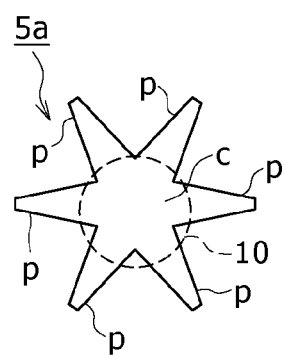
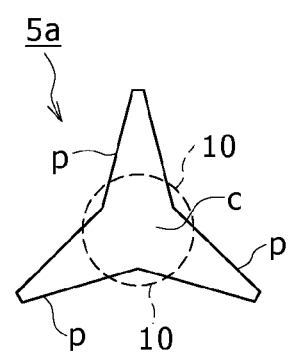
FIG.3
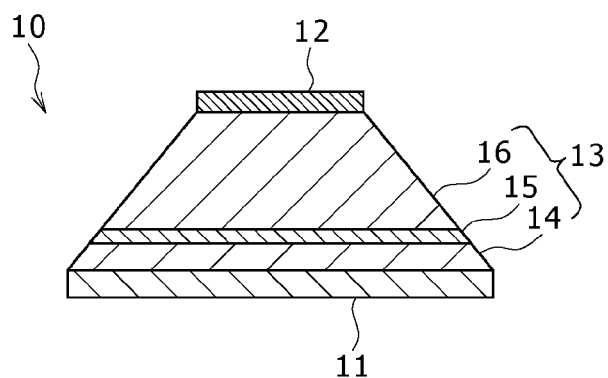

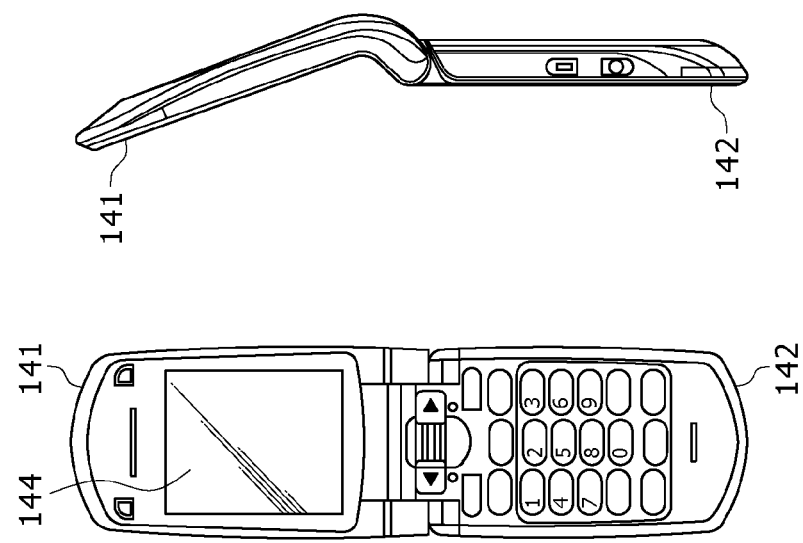
FIG.13A
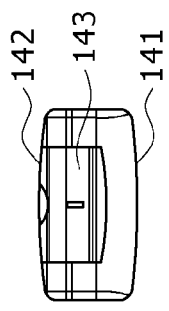
FIG.13B
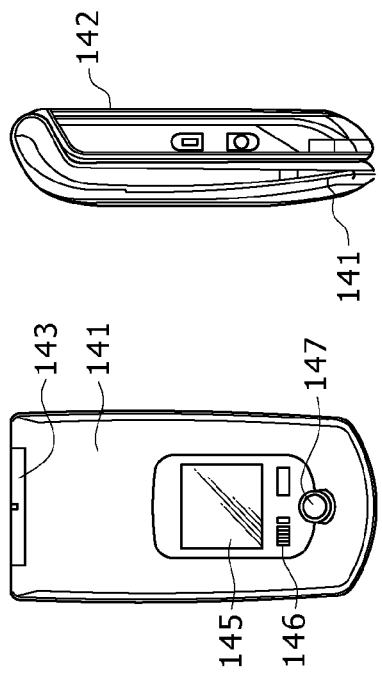
FIG.13D  FIG.13C  FIG.13E
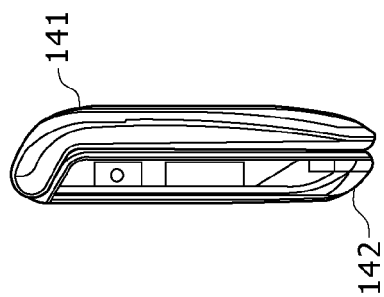
FIG.13F  FIG.13G
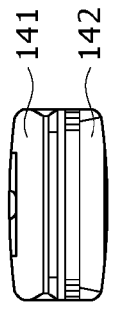

SUBSTRATE WITH CHIPS MOUNTED THEREON, METHOD OF MANUFACTURING SUBSTRATE WITH CHIPS MOUNTED THEREON, DISPLAY, AND METHOD OF MANUFACTURING DISPLAY

BACKGROUND OF THE INVENTION

1. Field of the Invention

The present invention relates to a substrate with chips mounted thereon, a method of manufacturing a substrate with chips mounted thereon, a display, and a method of manufacturing a display.

2. Description of the Related Art

At present, as a method for electrically connecting, for example, a light emitting device to a wiring or the like, an anisotropic conductive paste (ACP) is for instance used (see, for example, Japanese Patent Laid-Open No. Hei 11-177148, paragraph 0029). An anisotropic conductive paste, in general, is composed of conductive particles, a binder, and a solvent. After the anisotropic conductive paste is applied, drying and thermocompression bonding are carried out, whereby the light emitting device can be electrically connected to the wiring or the like.

SUMMARY OF THE INVENTION

However, when the device such as a light emitting device is sized to be several tens of micrometers or below, the size of the conductive particles contained in the anisotropic conductive paste relative to the device becomes comparatively large. This makes it difficult to securely achieve the electrical connection between the device and the wiring. In addition, it becomes easier for the device to be inclined on the wiring, with the conductive particulates as a fulcrum. Where a light emitting device is used, therefore, it is difficult to maintain a light-emitting surface of the device in a fixed direction. Furthermore, upon removal of that portion of the anisotropic conductive paste which is unnecessary, the binder is liable to be left as residue.

Moreover, in connecting the device to the wiring through the anisotropic conductive paste, the light emitting device has to be pressed against the wiring through the anisotropic conductive paste while applying thereto an external stimulus such as temperature (heat) or light. Accordingly, it is difficult to accurately fix the tiny device to the wiring.

Thus, there is a need for a substrate with chips mounted thereon in which the chips are fixed at predetermined positions over the substrate with good position accuracy, and a method of manufacturing a substrate with chips mounted thereon by which the chips can be positioned to predetermined positions in a self-matching manner and an enhanced throughput is hence promised. Besides, there is also a need for a display in which light emitting devices are used as the chips, and a method of manufacturing the same.

According to an embodiment of the present invention, there is provided a substrate with chip mounted thereon, including: a solder pattern having a plan-view shape in which projected parts are projected radially from a central part; and a chip fixed in the state of being aligned to the central part of the solder pattern.

According to another embodiment of the present invention, there is provided a method of manufacturing a substrate with chip mounted thereon, in which, the following steps are sequentially carried out. First, a solder-wettable pattern having a plan-view shape in which projected parts are projected radially from a central part is formed over a substrate. Next, a solder pattern having a plan-view shape which is substantially the same as the plan-view shape of the solder-wettable pattern is selectively formed over the solder-wettable pattern, and the solder pattern is pressed so as to flatten the solder pattern. Subsequently, a chip is mounted on the flattened solder pattern. Thereafter, reflow of the solder pattern is effected so as to move the chip to a position over the central part in a self-matching manner and to fix the chip in situ.

According to a further embodiment of the present invention, there are provided a display in which a light emitting device is used as the above-mentioned chip and a method of manufacturing the display.

According to the embodiments of the present invention as above, the chip is fixed at a position over the central part of the solder pattern having the plan-view shape in which the projected parts are projected radially from the central part. This is achieved through a process in which when reflow of the solder pattern is effected, the surface tension of the solder material causes the chip to be moved to a position over the central part of the radially projected plan-view shape of the solder pattern in a self-matching manner.

In accordance with the embodiments of the present invention, therefore, it is possible to obtain a substrate with chips mounted thereon or display in which chips such as light emitting devices are fixed at predetermined positions over a substrate with good position accuracy. The chips such as light emitting devices can be positioned to the predetermined positions in a self-matching manner, which promises enhanced throughput in manufacture of the substrate with chips mounted thereon or display.

BRIEF DESCRIPTION OF THE DRAWINGS

FIGS. 2A to 2C show plan views of openings which each define the plan-view shape of a solder pattern;

FIG. 3 illustrates a configuration of a light emitting device (LED chip) to be mounted;

FIGS. 10A and 10B show a digital camera to which an embodiment of the present invention is applied, in which FIG. 10A is a perspective view from the front side, and FIG. 10B is a perspective view from the back side;

FIGS. 13A to 13G show a portable terminal equipment, for example, a mobile phone to which an embodiment of the present invention is applied, wherein FIG. 13A is a front view of the mobile phone in an opened state, FIG. 13B is a side view of the same, FIG. 13C is a front view of the mobile phone in a closed state, FIG. 13D is a left side view, FIG. 13E is a right side view, FIG. 13F is a top plan view, and FIG. 13G is a bottom plan view.

DETAILED DESCRIPTION OF THE PREFERRED EMBODIMENTS

Now, embodiments of the present invention will be described below in the following sequence. Incidentally, in each of the embodiments below, configurations of a substrate with chips mounted thereon and a display will be described according to the sequence of manufacturing the display in which light emitting devices are used.
1. First Embodiment (an example of manufacture of a display having a substrate with chips, composed of light emitting devices, mounted thereon)
2. Second Embodiment (an example of manufacture of a display having packaged devices with chips, composed of light emitting devices, mounted therein)

1. First Embodiment

Figure 1A:
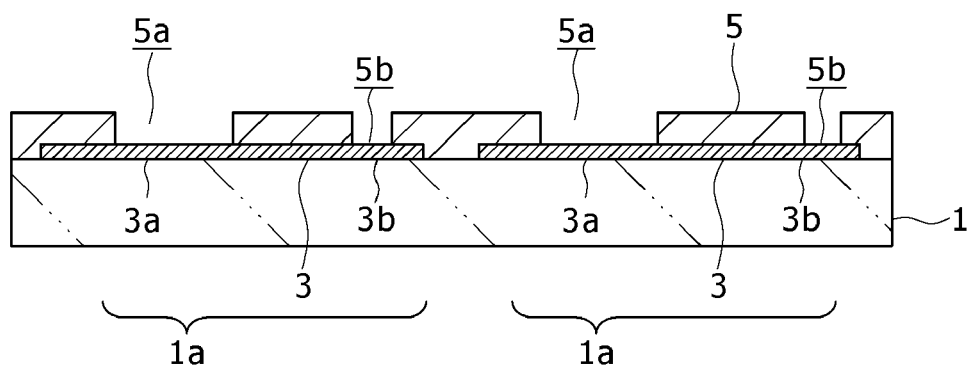
FIGS. 1A and 1B are manufacturing step views (Part 1) illustrating a manufacturing method according to a first embodiment of the present invention.
Figure 1B:
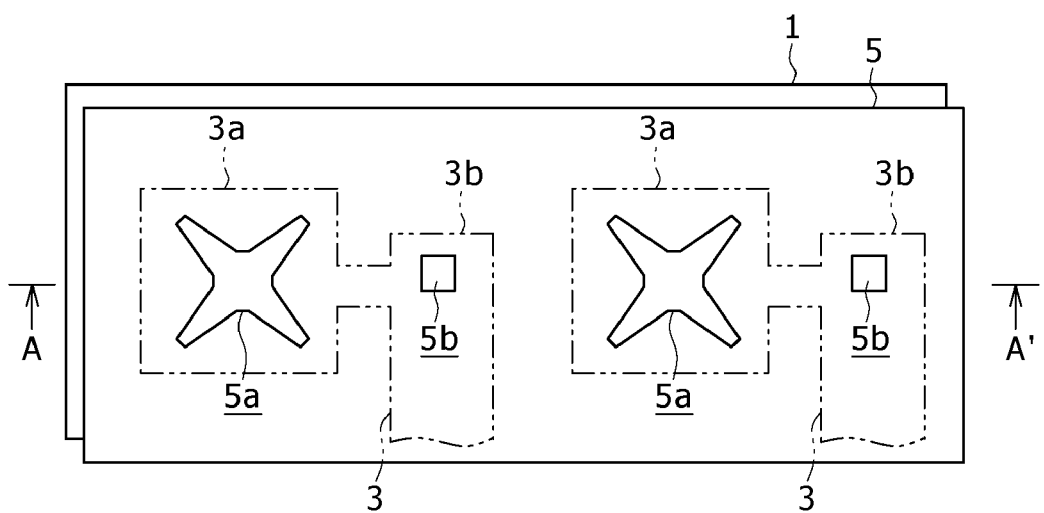

First, as shown in a sectional view in FIG. 1A and a plan view in FIG. 1B, wirings 3 are patterned in a required layout on a substrate 1 for a display. Incidentally, in the following embodiments, the sectional view in A in each drawing corresponds to a sectional view taken along line A-A' of a plan view in B.

As the substrate 1, a glass substrate or a plastic substrate or the like may be used, which is not particularly limited insofar as a surface layer thereof is kept insulating (dielectric).

The wirings 3 are to be connected to scanning lines of a display, for example, and are each provided correspondingly to each of pixel sections arranged and set on the substrate 1. Specifically, the wiring 3 is provided with a first pad section 3a for mounting a light emitting device to be described below, and a second pad section 3b as a connecting section for the light emitting device. Of these pad sections, the first pad section 3a is formed in a sufficient width for mounting the light emitting device. Besides, the second pad section 3b is formed in a sufficient width for serving as a bottom surface of a connection hole.

The wirings 3 shaped as above may be configured by use of a well-conductive material, and may not necessarily have a light-transmitting property. If required, the wirings 3 may have a laminated structure in which a material layer to be a seed layer in plating is provided on the upper side of a well-conductive layer. In an example, the surface of the wiring 3 has a configuration in which gold (Au), platinum (Pt), and titanium (Ti) are layered in this order. Incidentally, the wirings 3 may have a multilayer interconnection structure in which a plurality of layers are formed, with an insulating (dielectric) layer or layers present intermediately.

An insulating film 5 is formed over the substrate 1 provided with the wirings 3 as above. The insulating film 5 is configured by use of a material which is lowly wettable with a solder material. The solder material may be any metallic material that melts at a low temperature, and examples thereof include gold (Au)-tin (Sn) solder, lead-free solder, and, further, other eutectic materials. In this case, the insulating film 5 may be composed of, for example, an organic insulating material (e.g., polyimide), a resist material, or an inorganic insulating material (e.g., silicon oxide).

Next, the insulating film 5 is formed therein with openings 5a for exposing the first pad sections 3a of the wirings 3, and connection holes 5b for exposing the second pad sections 3b of the wirings 3. In this instance, the openings 5a are formed with good position accuracy and shape accuracy, which is important for self-matching alignment of the light emitting devices to be described below.

The openings 5a and the connection holes 5b are formed by etching the insulating film 5 while using as a mask a resist pattern formed by lithography. Besides, in the case where the insulating film 5 is composed of a photosensitive resist material film, the openings 5a and the connection holes 5b may be formed in the resist material film by lithography.

Here, in the first embodiment, the plan-view shape of the opening 5a is set characteristically. Specifically, the plan-view shape of the opening 5a is a shape in which projected parts are projected radially from a central part. FIGS. 2A to 2C show three examples of the plan-view shape of the opening 5a.

As shown in these figures, the opening 5a has a shape in which projected parts p are projected in radial directions from a central part c.

Of the parts of the opening 5a, the central part c has a plan-view shape which is substantially the same as the plan-view shape of a light emitting device 10 to be mounted on the substrate 1.

Here, the light emitting device 10 is, for example, an LED chip shown in FIG. 3. The light emitting device 10 has a configuration in which a light-emitting layer 13 having compound semiconductors laminated on each other is clamped between two electrodes, namely, a first electrode 11 and a second electrode 12.

The first electrode 11 is provided, for example, as a p-type electrode, and is composed of a metallic multilayer film in which silver (Ag), platinum (Pt), and gold (Au) are layered in this order from the side of the light-emitting layer 13. In addition, the first electrode 11 preferably has a configuration in which a nickel (Ni) layer is provided underneath gold (Au), as a barrier layer for solder. On the other hand, the second electrode 12 is provided, for example, as an n-type electrode, and is composed of a metallic multilayer film in which titanium (Ti), platinum (Pt), and gold (Au) are layered in this order from the side of the light-emitting layer 13.

Besides, the light-emitting layer 13 includes a first compound semiconductor layer 14, an active layer 15, and a second compound semiconductor layer 16 which are laminated in this order from the side of the first electrode 11. In the case where the light emitting device 10 is a blue light emitting diode, the first compound semiconductor layer 14 is composed, for example, of n-type gallium nitride (GaN). The active layer 15 is composed, for example, of a laminated structure of indium-gallium nitride (InGaN) and gallium nitride (GaN). The second compound semiconductor layer 16 is composed, for example, of p-type gallium nitride (GaN). Incidentally, the layer structure of the light-emitting layer 13 in the light emitting device 10 is selected appropriately on the basis of each luminescent color.

The light emitting device 10 as above is configured, for example, in a roughly truncated cone-like shape the diameter of which is gradually reduced from the side of the first electrode 11 toward the side of the second electrode 12. The roughly truncated cone-like shape has a diameter $\Phi$ of its base surface (the surface on the side of the first electrode 11) of about 20 μm, and a height of about 5 μm.

As shown in FIGS. 2A to 2C, it suffices for the central part c of the opening 5a to have a plan-view shape which is substantially the same as the plan-view shape of the light emitting device 10 on the first electrode 11 side, to such an extent as to substantially cover the bottom surface of the light emitting device 10. Preferably, the central part c of the opening 5a has a plan-view shape which is substantially the same as and slightly smaller than the plan-view shape of the bottom surface (the surface of the first electrode 11) of the light emitting device 10. It is preferable, therefore, that when the light emitting device 10 is placed over the central part c of the opening 5a, part of the first electrode 11 of the light emitting device 10 protrudes evenly in all directions from the central part c.

For instance, in relation to the diameter Φ of the base surface of the light emitting device 10, the width W of the narrowest opening width portion of the central part c is around a value satisfying the relation of W=Φ×(0.95 to 0.80).

Incidentally, the shape of the light emitting device 10 is not limited to the roughly truncated cone-like shape; for example, the bottom surface may have a quadrilateral shape. In this case, also, it suffices for the central part c of the opening 5a to have a plan-view shape which is substantially the same as the plan-view shape of the light emitting device 10 on the first electrode 11 side, to such an extent as to substantially cover the quadrilateral base surface of the light emitting device 10.

In addition, the projected parts p are projected in at least three directions from the central part c. The projection directions are preferably in symmetric directions (opposite directions), with the central part c as a center of symmetry. Further, the plurality of projected parts p are preferably spaced from each other angularly by regular angular intervals. Besides, the tips of the projected parts p are disposed on the circumference of a circle centered in the central part c, more accurately, on the circumference of a circle centered on the center of or the center of gravity of the central part c. The size of the circumference of the circle on which the tips of the projected parts p are located is not particularly limited. However, it is preferable that the circle is as large as possible within the range that does not matter on a layout basis. For example, the circumference of the circle has a diameter of about 40 µm.

Therefore, in the case where the plan-view shape of the opening 5a has the projected parts p projected in four directions from the central part c, as shown in FIG. 2A, the projected parts p are extended in ±x directions and ±y directions so that the adjacent ones of the projected parts p are maintained at an angle of 90° to each other. FIGS. 1A and 1B show this exemplary case.

In addition, as shown in FIG. 2B, the plan-view shape of the opening 5a may have the projected parts p projected in six directions from the central part c. In this case, the projected parts p are extended in respective directions such that the adjacent ones of the projected parts p are kept at an angle of 60° to each other.

Further, as shown in FIG. 2C, the plan-view shape of the opening 5a may have the projected parts p projected in three directions from the central part c. In this case, the projected parts are extended in respective directions such that the adjacent ones of the projected parts p are maintained at an angle of 120° to each other.

Incidentally, it suffices for the plan-view shape of the opening 5a to be appropriately selected according to the bottom surface shape of the chips (here, the light emitting devices 10) to be mounted on the substrate 1. For instance, when the bottom surface of the light emitting device 10 is circular, the opening 5a may have any plan-view shape. When the bottom surface of the light emitting device 10 is quadrilateral, a configuration in which the projected parts p are provided in four directions as shown in FIG. 2A is preferably selected. Further, when the bottom surface of the light emitting device 10 is triangular, a configuration in which the projected parts p are provided in three directions as shown in FIG. 2C is preferably selected.

Besides, the plan-view shape of the opening 5a is not limited to the configurations shown in FIGS. 2A to 2C. A configuration may be adopted in which the projected parts p are laid out in an appropriate state according to the bottom surface shape of the light emitting devices 10 to be mounted here. For instance, where the bottom surface of the light emitting device 10 is rectangular, the opening 5a may have a shape in which the projected parts p are projected on the diagonals of the relevant rectangle.

On the other hand, as shown in FIGS. 1A and 1B, the connection hole 5b provided in the insulating film 5 together with the opening 5a is not particularly limited in plan-view shape insofar as the second pad section 3b of the wiring 3 is exposed at the bottom surface of the connection hole 5b.

Figure 4A:
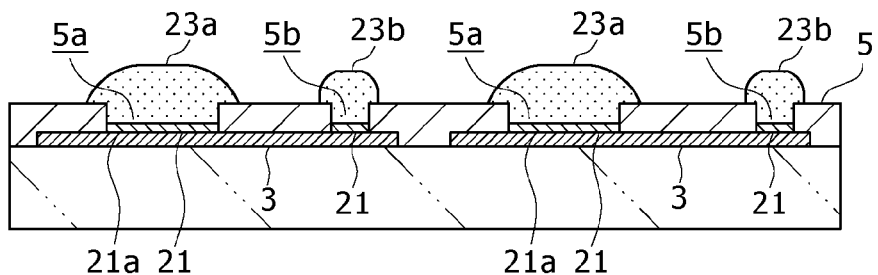
FIGS. 4A to 4D are manufacturing step views (Part 2) illustrating the manufacturing method according to the first embodiment.
Figure 4B:
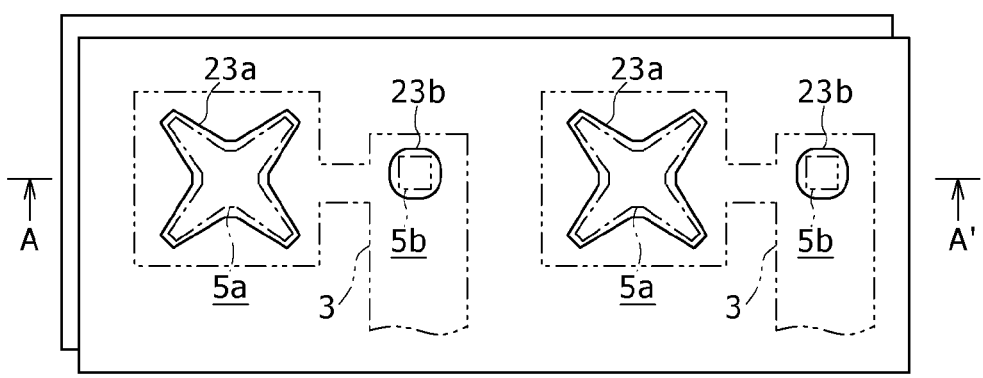

Subsequently, as shown in FIGS. 4A and 4B, a solder wetting layer 21 is formed on the wirings 3 exposed at the bottom surfaces of the openings 5a and the connection holes 5b. In this case, a plating method is applied, whereby the solder wetting layer 21 composed of a metallic material is selectively formed only on the exposed surfaces of the wirings 3 which are exposed at the bottom surfaces of the openings 5a and the connection holes 5b. As a result, a solder-wettable pattern 21a composed of the solder wetting layer 21 is formed at the bottom surfaces of the openings 5a with good position accuracy and shape accuracy.

The solder-wettable pattern 21a formed at the bottom surface of the opening 5a in this manner is formed in the same plan-view shape as the opening 5a. Therefore, at the bottom portion of the opening 5a, there is formed the solder-wettable pattern 21a having a plan-view shape which is the same as the plan-view shape of the opening 5a and in which projected parts are projected radially from a central part.

In addition, the solder wetting layer 21 is configured by use of a metallic material which is well-wettable with solder and capable of restraining diffusion of the solder; preferably, the solder wetting layer 21 functions as a barrier layer for the solder. As the just-mentioned metallic material, for example, nickel (Ni) is used. Besides, it is further preferable, for the purpose of preventing oxidation, to apply a configuration in which a gold (Au) film is laminated on a nickel (Ni) film.

Incidentally, in forming the above-mentioned solder wetting layer 21, it suffices for the solder-wettable pattern 21a exposed from the opening 5a to have a plan-view shape in which the projected parts p are provided to extend radially from the central part c, as has been described referring to FIGS. 2A to 2C above. Therefore, it suffices for the solder wetting layer 21 to be provided over the whole area of the bottom surfaces of the openings 5a and the connection holes 5b, or to be extendingly provided underneath the insulating film 5. It is to be noted in this case that a procedure is adopted in which the insulating film 5 is formed after the solder wetting layer 21 is formed on the wirings 3.

Next, solder is grown over the wirings 3 covered with the solder wetting layer 21, thereby to form a solder patterns 23a on the openings 5a and to form solder bumps 23b on the connection holes 5b. As a result, the solder patterns 23a and the solder bumps 23b connected to the wirings 3 via the solder wetting layer 21 are obtained.

In this instance, a plating method is applied, whereby the solder wetting layer 21 is used as an electrode and the solder is selectively grown on exposed portions of the electrode, thereby forming the solder patterns 23a. Here, the solder is grown in a film thickness greater than the depth of the openings 5a and the connection holes 5b, to such an extent that upon flattening of the solder patterns 23a to be conducted subsequently, the solder patterns 23a will be spread to a sufficiently wide plan-view shape. Incidentally, if the volume of the solder is too large, the light emitting device 10 would be inclined at the time of the subsequent soldering of the light emitting device 10. Here, therefore, the solder patterns 23a are formed by growing the solder up to a level of about 1 to 10 μm higher than the top surface of the insulating film 5, for example. By this, there are formed the solder patterns 23a having a plan-view shape which is substantially the same as the opening shape of the openings 5a and as the plan-view shape of the solder-wettable patterns 21a at the bottom portions of the openings 5a, specifically, the solder patterns 23a having a plan-view shape in which the projected parts p are provided to extend radially from the central part c, as has been described referring to FIGS. 2A to 2C above. In addition, the solder bumps 23b having a plan-view shape which is substantially the same as the opening shape of the connection holes 5b and as the plan-view shape of the solder wetting layer 21 at the bottom portions of the connection holes 5b are formed on the connection holes 5b.

Incidentally, if the height of the solder grown exceeds the depth of the openings 5a and the connection holes 5b in the growing process of the solder by the plating method, the solder may grow also in horizontal directions. In this case, the plan-view shape of the solder pattern 23a is substantially similar to, is substantially the same as, and is a little larger than the plan-view shape of the opening 5a and the solder-wettable pattern 21a at the bottom surface of the opening 5a. Similarly, the plan-view shape of the solder bump 23b is substantially similar to, is substantially the same as, and is a little larger than the plan-view shape of the connection hole 5b and the solder wetting layer 21 at the bottom surface of the connection hole 5b.

Here, the width W of the narrowest opening width portion of the central part c in the opening 5a (or the solder-wettable pattern 21a) in relation to the diameter Φ of the bottom surface of the light emitting device 10 described referring to FIG. 2A above is determined by the height of the solder grown, within the range of W=Φ×(0.95 to 0.80). In other words, it is preferable that the volume of the solder material protruding from the upper portion of the opening 5a is set to a predetermined value in relation to the bottom surface of the light emitting device 10.

Figure 4C:
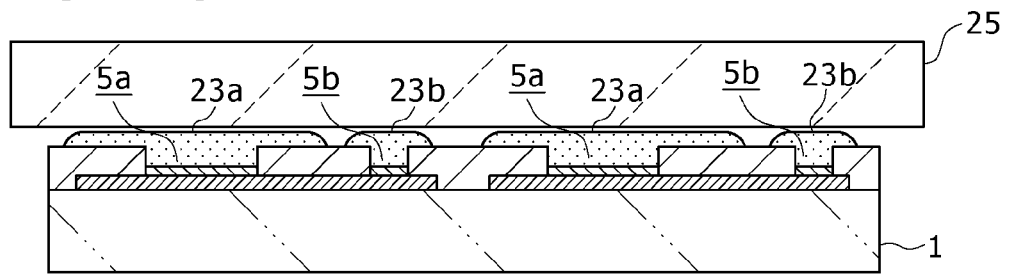
Figure 4D:
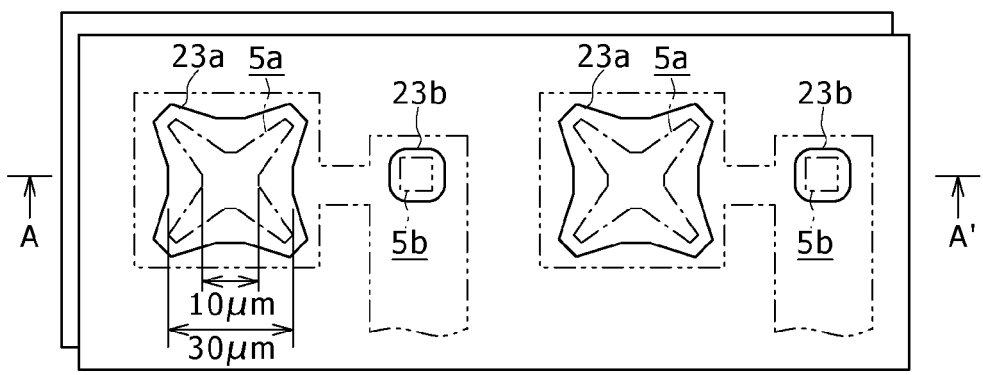

Subsequently, as shown in FIGS. 4C and 4D, the solder patterns 23a and the solder bumps 23b are pressed by a flat plate 25 disposed opposite to the substrate 1. In this instance, the solder patterns 23a and the solder bumps 23b are put into a reflow state. As a result, the surfaces of the solder patterns 23a and the solder bumps 23b are made flat and equalized in height, namely, the so-called flattening is achieved. Besides, by the flattening, the solder patterns 23a and the solder bumps 23b are enlarged in plan-view shape. In this case, the solder pattern 23a and the solder bump 23b may be enlarged in plan-view shape within such a range that they would not make contact with the adjacent solder pattern 23a or solder bump 23b.

Figure 5A:
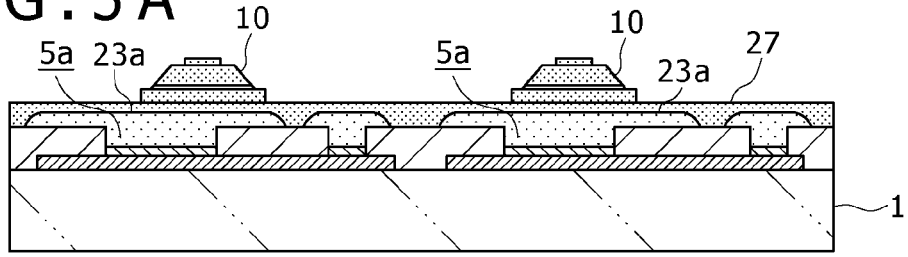
FIGS. 5A to 5D are manufacturing step views (Part 3) illustrating the manufacturing method according to the first embodiment.
Figure 5B:
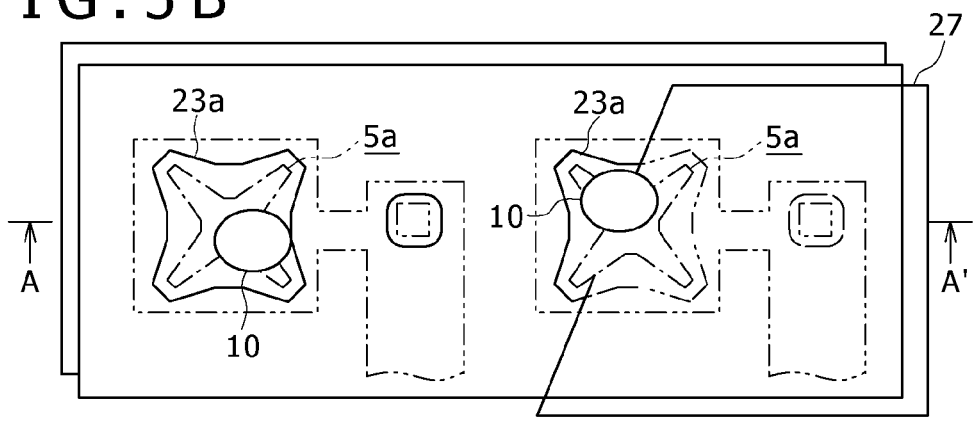

Thereafter, as shown in FIGS. 5A and 5B, a soldering flux 27 is applied to form a film on the upper side of the substrate 1 in the state of covering the solder patterns 23a and the solder bumps 23b which have been flattened as above.

Next, the light emitting devices 10 are mounted over the solder patterns 23a, with the soldering flux 27 therebetween. Here, the light emitting devices 10 are adhered and fixed onto the solder patterns 23a by utilizing the viscosity possessed by the soldering flux 27. In this instance, the soldering flux 27 is heated, as required, to impart a viscosity to the soldering flux 27.

In addition, the mounting of the light emitting devices 10 over the solder patterns 23a of the substrate 1 is carried out collectively by film transfer, for example. In this case, on a film substrate different from the substrate 1, a plurality of the light emitting devices 10 are adhered and fixed in the state of being arranged correspondingly to the arrangement of the solder patterns 23a on the substrate 1. In this instance, for example, light emitting devices 10 for three colors of red (R), green (G), and blue (B) are grouped as a set, and the light emitting devices 10 are arranged in repeated arrangement patterns of the sets. In addition, the light emitting devices 10 formed on a wafer in the state of being arranged in high density are expanded on an interval basis so as to conform to the pixel pitch in the intended display, and are thereby newly arranged on the film substrate.

Then, in the case of mounting the light emitting devices 10 over the solder patterns 23a of the substrate 1, the substrate 1 and the film substrate are disposed opposite to each other so as to bring the solder patterns 23a and the light emitting devices 10 into one-to-one correspondence. It suffices, in this condition, for the film substrate and the substrate 1 to be pressed against each other, whereby the light emitting devices 10 on the film substrate side are collectively transferred onto the substrate 1 side.

Here, the mounting position of the light emitting device 10 over the solder pattern 23a may be arbitrary insofar as the mounting position is over the solder pattern 23a spread in plan-view shape by the flattening, and may be deviated from the central part c of the opening 5a. Therefore, while the position accuracy of the light emitting devices 10 on the substrate 1 at this time point depends on the position accuracy of the light emitting devices 10 on the film substrate, the light emitting devices 10 on the film substrate are not required to be arranged with a high position accuracy.

Figure 5C:
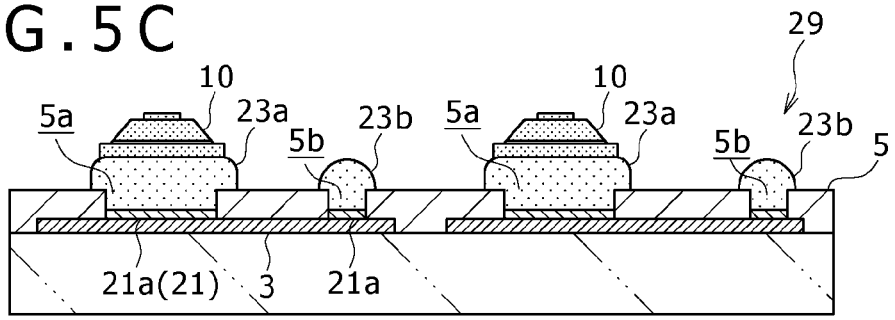
Figure 5D:
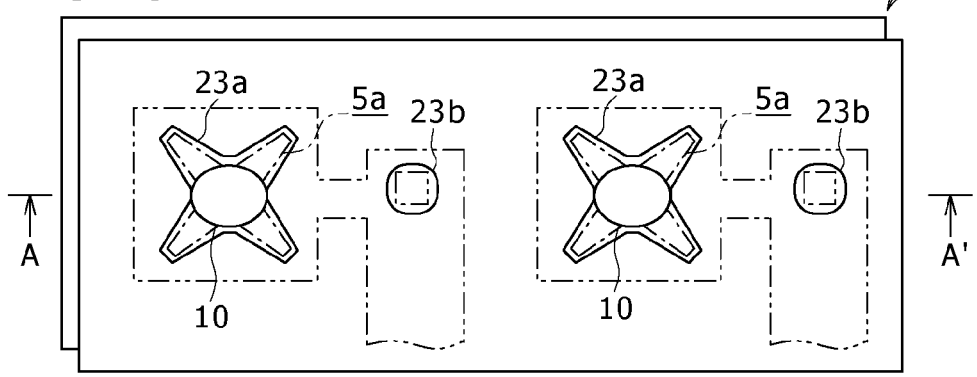

In the thus-attained condition, the solder patterns 23a and the solder bumps 23b are subjected to a reflow treatment, as shown in FIGS. 5C and 5D, whereby the light emitting devices 10 are soldered and fixed onto the substrate 1. In the reflow treatment, due to the surface tension of the solder, the solder is repelled by the surfaces of the insulating film 5 being lowly wettable with the solder. As a result, the solder material is converged into spaces over the openings 5a and the connection holes 5b, with the solder wetting layer 21 constituting the bottom surfaces.

Therefore, the plan-view shapes of the solder patterns 23a and the solder bumps 23b having been spread by the flattening are returned to the shapes which are substantially the same as the plan-view shapes of the solder wetting layer 21 exposed at the bottom surfaces of the openings 5a and the connection holes 5b. Accordingly, the solder pattern 23a is converged into the shape which is substantially similar to, and may be substantially the same as and a little larger than, the plan-view shape of the opening 5a and the solder-wettable pattern 21a at the bottom surface of the opening 5a, as described referring to FIGS. 2A to 2C above. Similarly, the solder bump 23b is converged into the shape which is substantially similar to, and may be substantially the same as and a little larger than, the plan-view shape of the connection hole 5b and the solder wetting layer 21 at the bottom surface of the connection hole 5b.

Attendant on the convergence of the solder material, the light emitting device 10 moves along the surface of the solder material, to be positioned in the central part c of the solder-wettable pattern 21a at the bottom surface of the opening 5a in a self-matching manner and be fixed in situ.

In this instance, as has been described referring to FIGS. 2A to 2C, the opening 5a (or the solder wetting pattern 21a) has a shape in which the projected parts p are projected in at least three directions from the central part c. Therefore, the light emitting device 10 is moved to a position substantially over the central part c due to the surface tensions of the solder which are converged in the at least three directions.

In addition, where the opening 5a (or the solder wetting pattern 21a) has a shape in which the projected parts p are projected in symmetric directions about the central part c, the light emitting device 10 is moved to a position substantially over the central part c due to the surface tensions of the solder which are converged in the symmetric two directions.

Further, the shape of the opening 5a (or the solder wetting pattern 21a) is so configured that the projected parts p are set at regular angular intervals. Therefore, the light emitting device 10 is moved to a position substantially over the central part c due to the surface tensions of the solder which are converged in the respective directions set at even angular intervals around the central part c.

Here, the tips of the projected parts p are disposed on the circumference of a circle centered in the central part c. Therefore, the magnitudes of the surface tensions in the above-mentioned directions can be substantially equalized.

Moreover, simultaneously when the light emitting device 10 is moved to a position over the central part c as above-mentioned, the light emitting device 10 is fixed in the condition where the (planar) bottom surface thereof is kept to be horizontal relative to (be parallel to) the substrate 1. Furthermore, where the bottom surface of the light emitting device 10 is polygonal in shape, setting the number of the projected parts p in conformity with the relevant polygon ensures that the rotating direction of the light emitting device 10 is self-aligned to a predetermined direction.

Incidentally, after the reflow treatment as above-mentioned, a step of removing the soldering flux by washing is performed.

In the above-described manner, there is obtained a substrate with chips mounted thereon, 29, including the solder patterns 23a having a plan-view shape in which the projected parts p are projected radially from the central part c, and the light emitting devices (LED chip) 10 arranged and fixed in the state of being aligned to the central parts c of the solder patterns 23a, over the substrate 1.

Now, a process of manufacturing a display by use of the substrate 29 with the light emitting devices 10 mounted thereon as above-mentioned will be described below.

Figure 6A:
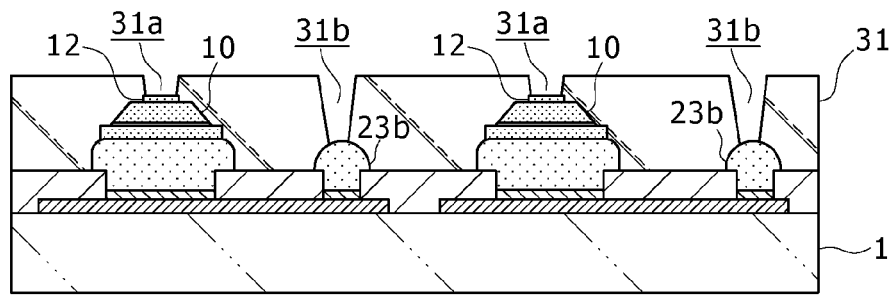
FIGS. 6A to 6C are manufacturing step views (Part 4) illustrating the manufacturing method according to the first embodiment.

First, as shown in FIG. 6A, an interlayer dielectric film 31 is formed over the substrate 1 in the state of covering the light emitting devices 10. Then, the interlayer dielectric film 31 is formed therein with connection holes 31a reaching the second electrodes 12 of the light emitting devices 10, and connection holes 31b reaching the solder bumps 23b.

Figure 6B:
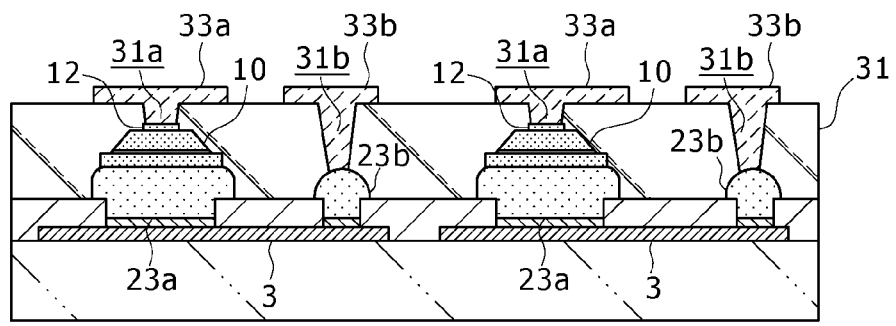

Next, as shown in FIG. 6B, on the interlayer dielectric film 31, signal lines 33a each connected to the second electrode 12 of the light emitting device 10 through the connection hole 31a are formed, and scanning lines 33b each connected to the solder bump 23b through the connection hole 31b are formed. The scanning line 33b is connected to the first electrode 11 of the light emitting device 10 through the solder bump 23b, the wiring 3, and the solder pattern 23a.

Figure 6C:
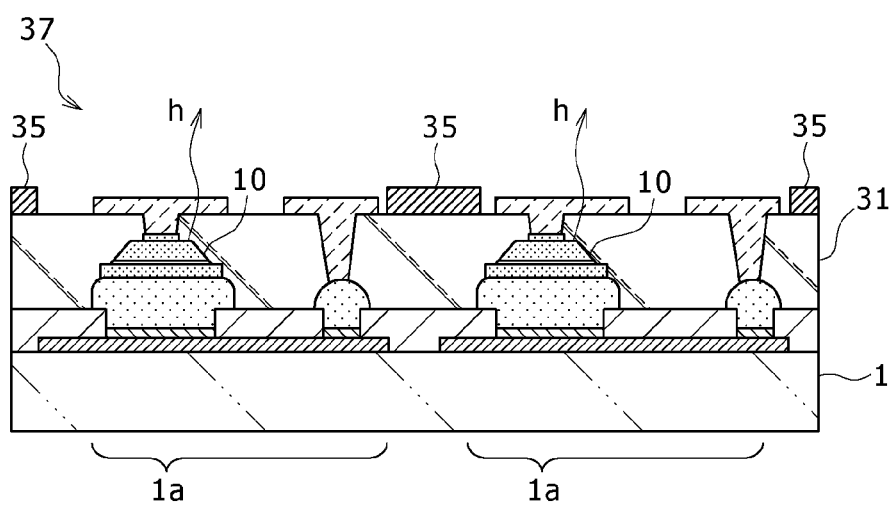

Thereafter, as shown in FIG. 6C, a light-shielding film 35 to be a black matrix is formed on the interlayer dielectric film 31 at positions corresponding to areas between pixels 1a and 1a, to complete the display 37. The display 37 is of the type in which luminescent light (emitted light) h is taken out on the opposite side from the substrate 1. Besides, in this display 37, both the two electrodes 11 and 12 provided for each light emitting device 10 are led out on the opposite side from the substrate 1.

According to the first embodiment as above-described, the solder patterns 23 by which the light emitting devices 10 are fixed onto the substrate 1 each have a plan-view shape in which the projected parts p are provided to extend radially from the central part c. While the solder pattern 23a is provided in such a plan-view shape, the light emitting device 10 is fixed to the central part c of the solder pattern 23a. This is the result of a process in which, upon reflow of the solder pattern 23a, the surface tension of the solder material causes the light emitting device 10 to move to a position over the central part c of the radially projected plan-view shape of the solder pattern 23a in a self-matching manner.

Therefore, where the solder patterns 23a are formed with good position accuracy and shape accuracy by, for example, lithography, the light emitting devices 10 aligned to the solder patterns 23a in a self-matching manner are also kept good in position accuracy on the substrate 1. Accordingly, it is possible to obtain the substrate with chips mounted thereon, 29, and the display 37, wherein the chips such as the light emitting devices 10 are arranged and fixed on the substrate 1 with good position accuracy.

As an example, while using light emitting devices 10 having a □22 µm square bottom surface shape and solder patterns having a shape in which projected parts p are provided to extend in four directions from a central part c as shown in FIG. 2A, soldering of the light emitting devices 10 was conducted by applying each opening 5a in the condition of W1=20 µm×(1.40 to 0.80). The angle between the adjacent ones of the projected parts p was 90°, and the circumference of a circle on which the tips of the projected parts p were disposed had a diameter of 40 µm.

As a result, there could be confirmed a self-aligning effect such that self-matching alignment was achieved with an accuracy to within ±1 µm in the range of W1=20 µm×(0.95 to 0.80). In this case, in the condition where the light emitting devices 10 are mounted over the substrate 1 as shown in FIG. 6A, misregistrations of ±30 µm at maximum could be self-matchingly aligned to attain a position accuracy to within ±1 µm. In addition, the light emitting devices 10 were free of inclination, by which it was confirmed possible to solder the light emitting devices 10 in the condition where their planar bottom surfaces are kept horizontal relative to (parallel to) the surface of the substrate 1.

Since the chips such as the light emitting devices 10 can be self-matchingly positioned relative to the solder patterns 23a as above-mentioned, it is possible to attain an enhanced throughput in manufacture of the substrate with chips mounted thereon, 29, and the display 37. Specifically, the position accuracy in transferring the light emitting devices 10 onto the substrate 1 and fixing them in situ is in a trade-off relation with the throughput. As above-mentioned, however, the position accuracy in mounting the light emitting devices 10 over the solder patterns 23a may involve misregistrations of about ±30 µm at maximum. Therefore, notwithstanding a final position accuracy as high as ±1 µm can be obtained, a remarkable enhancement of throughput can be achieved.

Furthermore, since the light emitting devices 10 can be mounted on the substrate 1 with good position accuracy as above-mentioned, the alignment margin for formation of the connection holes 31a reaching the second electrodes 12 of the light emitting devices 10 can be reduced. This makes it possible to reduce the second electrodes 12 in size, which promises an enhanced light taking-out efficiency in the process in which the luminescent light h generated by the light emitting device 10 is taken out on the side of the second electrode 12.

Moreover, the compound semiconductor material (GaN) constituting the light-emitting layer 13 of the light emitting device 10 is little wettable with the solder material (Au—Sn). Therefore, it is unnecessary to form a shortcircuit-preventive insulating film at the exposed surface of the light-emitting layer 13, so that the manufacturing process can be simplified.

In addition, when a defect is found in a pixel in the condition of the substrate with chips mounted thereon, 29, it suffices to selectively remove the solder pattern 23a and the light emitting device 10 relevant to the defective pixel. Therefore, repair on a pixel basis is possible.

2. Second Embodiment

The second embodiment pertains to an example of manufacture of a display in which packaged devices each obtained by packaging a plurality of light emitting devices are mounted on a substrate. Here, major parts concerning the mounting and fixation of the light emitting devices are the same as those in the first embodiment above. In the following description made referring to FIGS. 7A to 8C, the same components as those in the first embodiment above will be denoted by the same symbols as used above, and the same descriptions as above will be omitted.

Figure 7A:
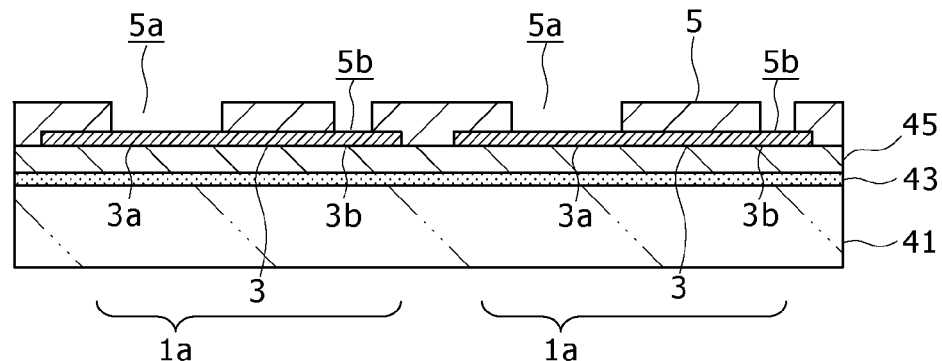
FIGS. 7A to 7C are manufacturing step views (Part 1) illustrating a manufacturing method according to a second embodiment of the invention.
Figure 7B:
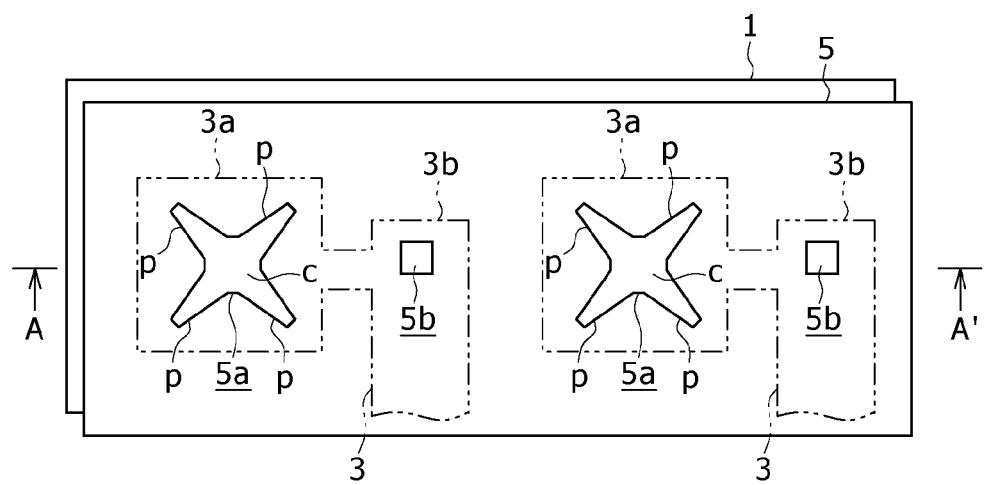

First, as shown in FIGS. 7A and 7B, an adhesive layer 43 and an insulating layer 45 are formed in this order over a first substrate 41. The second embodiment differs from the first embodiment in this laminated structure of the substrate.

Then, wirings 3 are patterned on the insulating layer 45 in a layout as required. Like in the first embodiment, the wiring 3 is provided with a first pad section 3a for mounting a light emitting device to be described below, and a second pad section 3b as a connecting section for the light emitting device. In addition, the layer configuration of the wirings 3, which may have a multilayer interconnection structure as required, is also the same as in the first embodiment.

Next, like in the first embodiment, an insulating film 5 is formed over the substrate 1 provided with the wirings 3, and the insulating film 5 is formed therein with openings 5a for exposing the first pad sections 3a of the wirings 3 and with connection holes 5b for exposing the second pad sections 5b of the wirings 3. Besides, it is particularly important that the openings 5a should each have a plan-view shape in which projected parts are projected radially from a central part, like in the above description made while showing examples in FIGS. 2A to 2C in the first embodiment.

The subsequent steps are carried out in the same manner as described above referring to FIGS. 4A to 5D in the first embodiment. Specifically, in the same manner as described referring to FIGS. 4A and 4B above, a solder wetting layer 21 is formed on the wirings 3 exposed at bottom surfaces of the openings 5a and the connection holes 5b, and the solder wetting layer 21 in the openings 5a is made to be solder-wettable patterns 21a having the same plan-view shape as the openings 5a. Next, solder patterns 23a and solder bumps 23b are formed on the solder wetting layer 21.

Thereafter, in the same manner as described referring to FIGS. 4C and 4D above, the solder patterns 23a and the solder bumps 23b are flattened so that they are spread in plan-view shape.

Subsequently, in the same manner as described referring to FIGS. 5A and 5B above, the light emitting device 10 is mounted at a position over each of the thus flattened solder patterns 23a, with a soldering flux 27 therebetween. In this instance, mounting of the light emitting devices 10 may be collectively carried out by, for example, film transfer, in the same manner as in the first embodiment. Here, it is important that the light emitting devices 10 for three colors of red (R), green (G), and blue (B) are grouped as a set, and the light emitting devices 10 are arranged on the first substrate 41 in repeated arrangement patterns of the sets.

Next, in the same manner as described referring to FIGS. 5C and 5D, the solder patterns 23a and the solder bumps 23b are subjected to a reflow treatment, whereby the light emitting devices 10 are positioned over the central parts c of the solder-wettable patterns 21a at the bottom surfaces of the openings 5a in a self-matching manner, and fixed in situ.

Figure 7C:
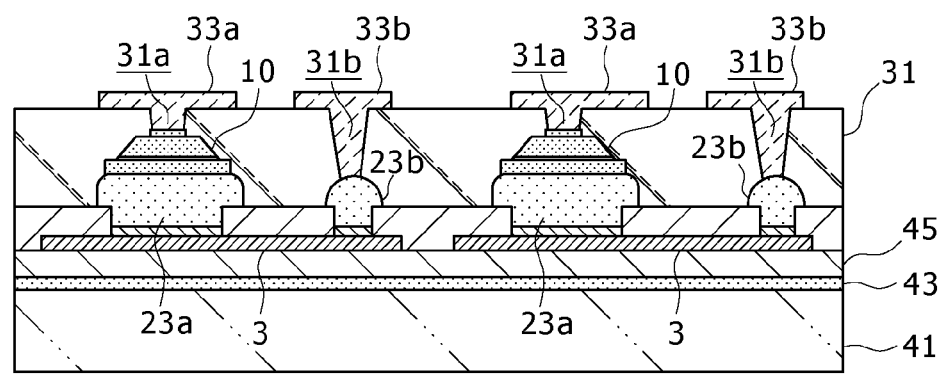

In this manner, as shown in FIG. 7C, the light emitting devices (LED chips) 10 are mounted and fixed on the solder patterns 23a each having a plan-view shape in which the projected parts p are projected radially from the central part c, in the state of being aligned to the central parts c of the solder patterns 23a in a self-matching manner.

Subsequently, the same process as described referring to FIGS. 6A and 6B in the first embodiment above is carried out, whereby signal lines 33a and scanning lines 33b covering the light emitting devices 10 are provided.

Figure 8A:
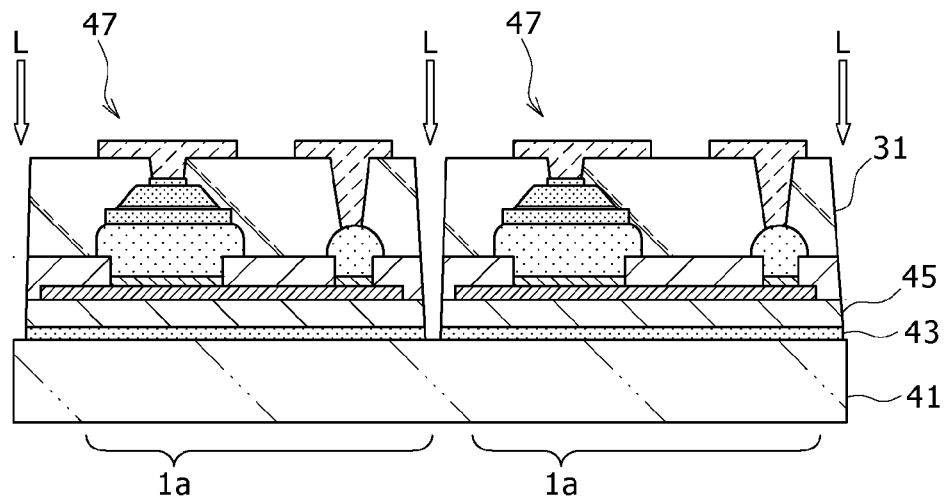
FIGS. 8A to 8C are manufacturing step views (Part 2) illustrating the manufacturing method according to the second embodiment.

The above-mentioned steps in the second embodiment may be carried out in the same manner as in the first embodiment, whereas the subsequent and latter steps are peculiar to the second embodiment. First, as shown in FIG. 8A, between pixels 1a each having the light emitting devices 10 for three color as a set, an interlayer dielectric film 31 and underlying layers are separated by a groove reaching the first substrate 41 or the adhesive layer 43. The separation is performed by irradiation with a laser beam L, for example. The portions separated from each other in this manner constitute the respective optical packaged devices 47. Incidentally, in the drawing, the optical packaged device 47 is composed of the light emitting devices 10 for three colors which are arranged in the depth direction of the drawing and grouped as a set.

Figure 8B:
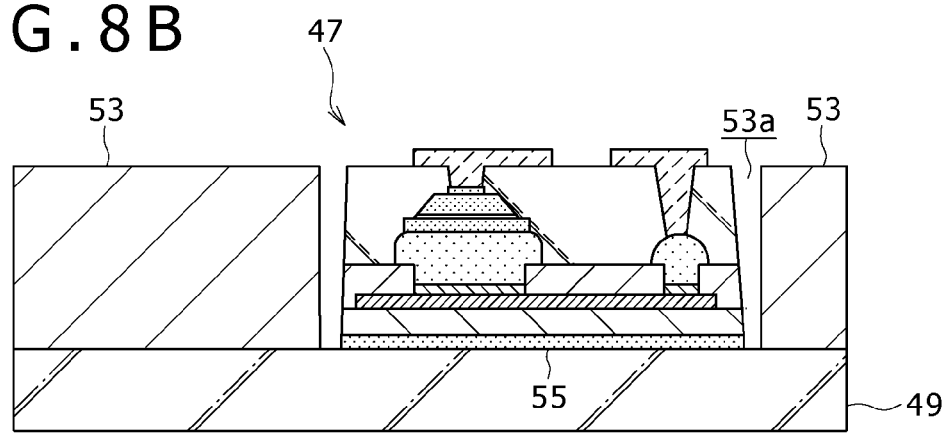

Next, as shown in FIG. 8B, the optical packaged devices 47 thus separated are transferred onto a second substrate 49. A structure 53 provided with wirings and the like are disposed on the second substrate 49, and the optical packaged devices 47 are fixed in openings 53a provided in the structure 53, with an adhesive layer 55 therebetween.

Figure 8C:
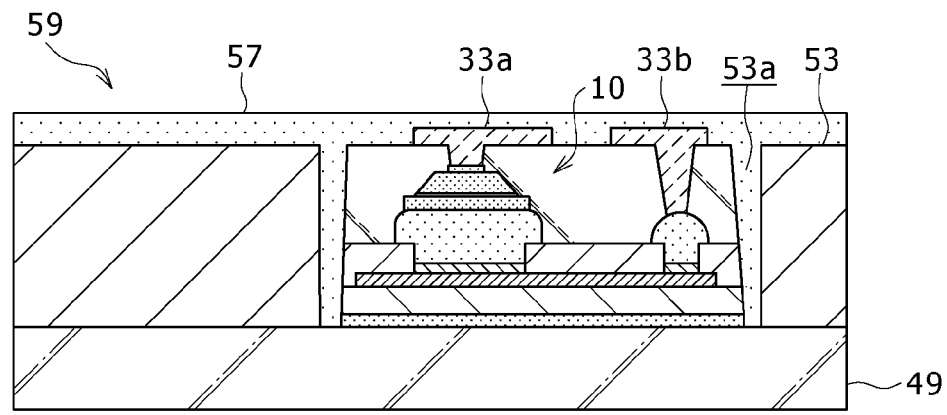

Subsequently, as shown in FIG. 8C, an insulating film 57 is formed on the second substrate 49 so as to fill up gaps present between each optical packaged device 47 and the opening 53a in the structure 53. Thereafter, though omitted in the drawings here, the wirings 33a and 33b connected to the light emitting devices 10 of each optical packaged device 47, as required, are connected to the wirings in the structure 53, to complete the display 59.

As has been described above, the present invention is applicable also to manufacture of the display 59 in which the optical packaged devices 47 are arranged. The display 59 is of the type in which the luminescent light h is taken out on the opposite side from the second substrate 49. In addition, the display 59 has a configuration in which both the two electrodes 11 and 12 provided for each light emitting device 10 are led out on the opposite side from the second substrate 49.

Besides, in the second embodiment, mounting of the light emitting devices 10 onto the first substrate 41 for forming the optical packaged devices 47 is carried out in the same manner as described referring to FIGS. 2A to 5D in the first embodiment above. Therefore, the solder patterns 23a each having a plan-view shape in which the projected parts p are projected radially from the central part c are provided on the first substrate 41, and the light emitting devices (LED chips) 10 can be aligned and fixed onto the central parts of the solder patterns 23a in a self-matching manner. Accordingly, the same effect as in the first embodiment can be obtained.

Incidentally, in the first embodiment and the second embodiment described above, configurations for mounting the light emitting devices 10 composed of LED chips on the substrate 1 have been described, taking manufacture of a display into consideration. However, the present invention is widely applicable to apparatuses (substrates with chips mounted thereon) in which small pieces (or chips) such as semiconductor chips and simple electrode chips have to be fixed on a substrate with good position accuracy.

In this instance, where the mounting surface of the chip to be mounted is the bottom surface of the chip, the shape of the solder pattern in relation to the bottom surface shape is the same as in the first embodiment above. Consequently, the same effect as described in the first embodiment above can be obtained.

Besides, in the first embodiment and the second embodiment described above, a configuration has been adopted in which the insulating film is provided with the openings 5a and the solder patterns 23a are formed at the bottom portions of the openings 5a. However, a configuration deprived of the insulating film may also be adopted, provided that the solder patterns 23a spread in plan-view shape by the flattening can each be converged by the reflow treatment into substantially the same shape as the solder-wettable pattern. In this case, for example, the flattening may be carried out after the insulating film 5 is removed, from the condition shown in FIGS. 4A and 4B.

Application Examples

The display according to an embodiment of the present invention as above-described is applicable to those displays of a variety of electronic apparatuses, for example, digital cameras, notebook type personal computers, portable terminal equipment such as mobile phones, or video cameras, as shown in FIGS. 9 to 13G, on which image signals inputted to the electronic apparatuses or image signals produced in the electronic apparatuses are displayed as images or pictures. Now, some examples of the electronic apparatuses to which the invention is applied will be described below.

Figure 9:
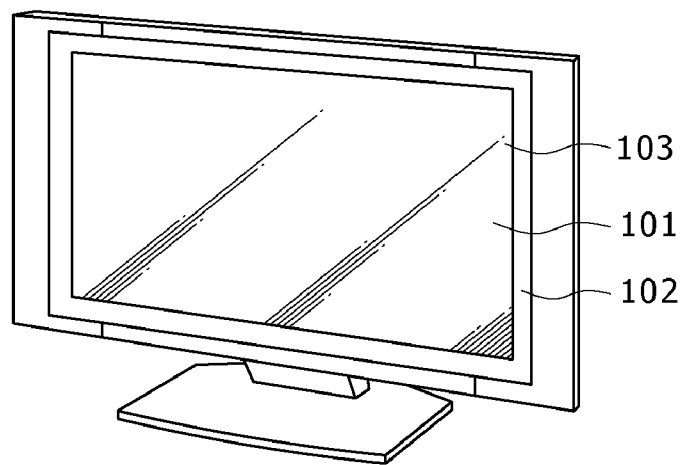
FIG. 9 is a perspective view of a television set to which an embodiment of the present invention is applied.

FIG. 9 is a perspective view of a television set to which the present invention is applied. The television set according to the present application example includes an image display screen section 101 composed of a front panel 102, a filter glass 103, etc. The television set is produced by use of the display according to an embodiment of the invention as the image display screen section 101.

Figure 10A:
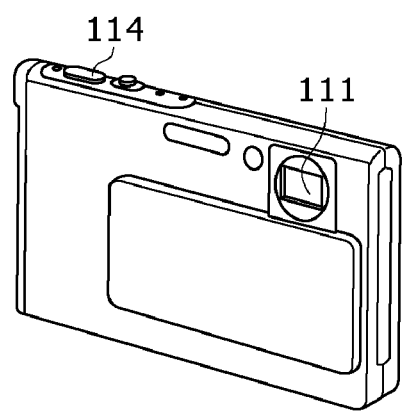
Figure 10B:
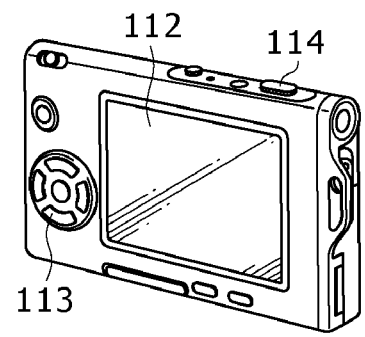

FIGS. 10A and 10B illustrate a digital camera to which the present invention is applied, wherein FIG. 10A is a perspective view from the front side, and FIG. 10B is a perspective view from the back side. The digital camera according to the present application example includes a flash light emitting section 111, a display section 112, a menu switch 113, a shutter button 114, etc. The digital camera is produced by use of the display according to an embodiment of the invention as the display section 112.

Figure 11:
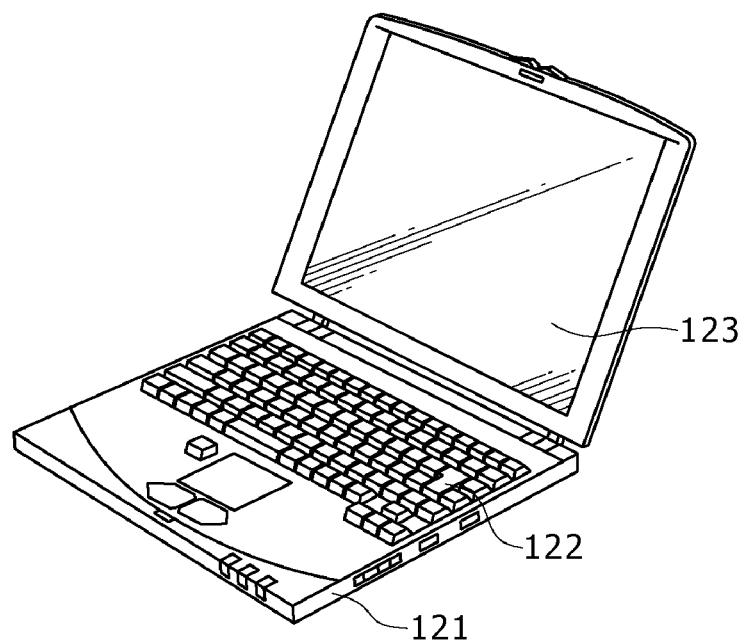
FIG. 11 is a perspective view of a notebook type personal computer to which an embodiment of the present invention is applied.

FIG. 11 is a perspective view of a notebook type personal computer to which the present invention is applied. The notebook type personal computer according to the present application example includes in a body 121 a keyboard 122 operated to input characters and the like, a display section 123 for displaying images, and so on. The notebook type personal computer is produced by use of the display according to an embodiment of the invention as the display section 123.

Figure 12:
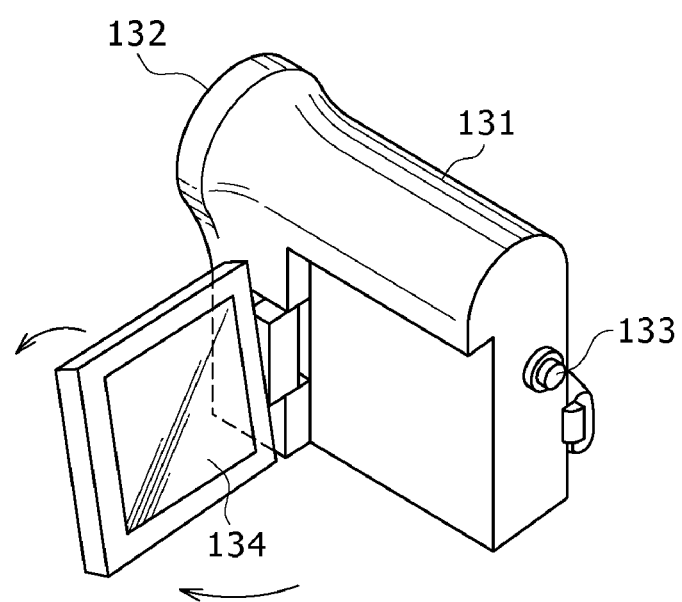
FIG. 12 is a perspective view of a video camera to which an embodiment of the present invention is applied.

FIG. 12 is a perspective view of a video camera to which the present invention is applied. The video camera according to the present application example includes a body section 131, a subject shooting lens 132 provided at a side surface oriented forward, a start/stop switch 133 operated at the time of shooting, a display section 134, etc. The video camera is produced by use of the display according to an embodiment of the invention as the display section 134.

FIGS. 13A to 13G illustrate a portable terminal equipment, for example, a mobile phone to which the present invention is applied, wherein FIG. 13A is a front view of the mobile phone in an opened state, FIG. 13B is a side view of the same, FIG. 13C is a front view of the equipment in a closed state, FIG. 13D is a left side view, FIG. 13E is a right side view, FIG. 13F is a top plan view, and FIG. 13G is a bottom plan view. The mobile phone according to the present application example includes an upper-side casing 141, a lower-side casing 142, a link section (here, a hinge section) 143, a display 144, a sub-display 145, a picture light 146, a camera 147, etc. The mobile phone is produced by use of the display(s) according to an embodiment(s) of the invention as either one or both of the display 144 and the sub-display 145.

The present application contains subject matter related to that disclosed in Japanese Priority Patent Application JP 2008-296512 filed in the Japan Patent Office on Nov. 20, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A substrate with chip mounted thereon, comprising:
    a solder pattern which in plan view has a central part from which projected parts extend radially from the central part; and
    a chip fixed in alignment with and over the central part of the solder pattern.

2. The substrate with chip mounted thereon according to claim 1, wherein the projected parts project radially in at least three different directions from the central part.

3. The substrate with chip mounted thereon according to claim 1, wherein the projected parts project radially in symmetric directions from the central part.

4. The substrate with chip mounted thereon according to claim 1, wherein the projected parts are arranged at regular angular intervals.

5. The substrate with chip mounted thereon according to claim 1, wherein, in plan view, the central part same as a bottom surface of the chip are shaped substantially the same.

6. The substrate with chip mounted thereon according to claim 1, wherein tips of the projected parts align on the circumference of a circle centered on the central part.

7. The substrate with chip mounted thereon according to claim 1, comprising a wiring over the substrate, wherein the solder pattern is connected to the wiring over the substrate.

8. The substrate with chip mounted thereon according to claim 1, comprising a wiring over the substrate, wherein:
    the solder pattern is connected to the wiring over the substrate; and
    the chip is a light emitting device having a light-emitting layer provided between two electrodes, with one of the two electrodes connected to the wiring through the solder pattern.

9. The substrate with chip mounted thereon according to claim 1, comprising plural solder patterns and plural chips mounted in alignment with and over the solder patterns, respectively, wherein the solder patterns and the chips mounted over the solder patterns are arrayed over the substrate.

10. A display comprising:
a substrate;
a solder pattern on the substrate, the solder pattern in plan view having a central part and projected parts that project radially from the central part; and
a light emitting device fixed in alignment with and over the central part of the solder pattern.

11. The display according to claim 10, wherein
the substrate includes a wiring thereover to which the solder pattern is connected; and
the light emitting device has a light-emitting layer disposed between two electrodes, with one of the two electrodes being connected to the wiring through the solder pattern.

12. The display according to claim 10, comprising plural solder patterns and plural light emitting devices mounted in alignment with and over the solder patterns, respectively, wherein the solder patterns and the light emitting devices are arrayed manner over a substrate.

* * * * *